US008000661B2

(12) United States Patent
Chiu et al.

(10) Patent No.: US 8,000,661 B2
(45) Date of Patent: Aug. 16, 2011

(54) COMMUNICATION SYSTEM WITH FREQUENCY-ADAPTIVE PREDISTORTER DESIGN

(75) Inventors: Mao-Ching Chiu, Chiayi County (TW); Wei-Ping Chuang, Kaohsiung (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 500 days.

(21) Appl. No.: 12/198,126

(22) Filed: Aug. 26, 2008

(65) Prior Publication Data

US 2010/0056082 A1 Mar. 4, 2010

(51) Int. Cl.
  *H04B 1/04* (2006.01)
(52) U.S. Cl. .................................. 455/114.3; 455/259
(58) Field of Classification Search .............. 455/114.2, 455/114.3, 255–259
See application file for complete search history.

(56) References Cited

U.S. PATENT DOCUMENTS

| 2004/0121741 A1* | 6/2004 | Rashev et al. ............... 455/114.3 |
| 2004/0246048 A1* | 12/2004 | Leyonhjelm et al. ............. 330/2 |
| 2005/0111575 A1* | 5/2005 | Taler et al. .................... 375/297 |

* cited by examiner

*Primary Examiner* — Nhan Le
(74) *Attorney, Agent, or Firm* — Winston Hsu; Scott Margo

(57) ABSTRACT

A communication system comprises a predistorter for distorting an input signal according to at least one parameter to generate a distorted signal, an amplifier for amplifying the distorted signal according to an input-output characteristic to generate an output signal, and a frequency-domain adaptive calibration module for adaptively adjusting the parameter of the predistorter according to a frequency characteristic of the output signal. Because the calibration is performed in the frequency domain, there is no need to precisely estimate the group delay formed by the feedback path. The system complexity is therefore reduced without loss of performance.

16 Claims, 7 Drawing Sheets

US 8,000,661 B2

COMMUNICATION SYSTEM WITH FREQUENCY-ADAPTIVE PREDISTORTER DESIGN

BACKGROUND

The present invention relates to a predistorter in a communication system, and more particularly, to a predistorter that is calibrated in the frequency domain.

The last stage of a transmitter is generally a power amplifier that dominates the power class of the transmitter, and the quality of the power amplifier significantly influences the system performance. Unfortunately, the input-output characteristics of the power amplifier are not always ideal: the power amplifier has a saturation region where the input-output characteristics become non-linear. In general, the power amplifier tends to become more non-linear as the input power level increases towards its maximum input power level. This kind of power amplifier will induce in-band and out-of-band distortions to signals having high peak-to-average power ration (PAPR), such as the orthogonal frequency division multiplexing (OFDM) signals, and will degrade the system performance since the OFDM signals have low tolerance and are sensitive to the nonlinear distortion of the power amplifier. The system therefore needs to make a tradeoff between efficiency and error vector magnitude (EVM).

Predistortion is a widely used and cost-saving technique for balancing off the nonlinearity of the power amplifier. FIG. 1 is a block diagram showing how a predistorter 112 and a power amplifier 114 are disposed in a transmitter 110. The predistorter 112 is expected to have a specific input-output characteristics that are inversely related to that of the power amplifier 114. Therefore, the overall system characteristics can become more linear. In order to achieve this goal, a feedback path 120 including a time-domain calibration circuit 122 is utilized to calibrate the input-output characteristics of the predistorter 112. The time-domain calibration circuit 122 compares the pre-distorted signal $S_{pd}$ output by the predistorter 112 and a feedback signal $S_{fb}$ in the time domain to detect the input-output characteristics of the power amplifier 114, wherein the feedback signal $S_{fb}$ is generated by a low noise amplifier (LNA) 124, a mixer 126, a filter 127 and an analog-to-digital converter (ADC) 128 (which operate reversely to the mixer 116, the filter 117 and the digital-to-analog converter (DAC) 118) processing the output signal $S_{out}$ of the power amplifier 114. According to the detected characteristics of the power amplifier 114, the time-domain calibration circuit 122 adjusts the characteristics of the predistorter 112 as the inverse of that of the power amplifier 114.

However, the time-domain calibration circuit 122 needs to compensate for the group delay formed by those circuits in the feedback path 120 before it compares the pre-distorted signal $S_{pd}$ and the feedback signal $S_{fb}$. Otherwise, the performance of the predistorter 112 will be degraded due to the misalignment of the pre-distorted signal $S_{pd}$ and the feedback signal $S_{fb}$. The delay time is uncertain, and the estimated error must be less than 0.3 sample periods or the performance of the predistorter 112 will become unacceptable. It therefore requires complex and precise synchronization hardware in the time-domain calibration circuit 122 for group delay estimation and compensation.

SUMMARY

One objective of the present invention is therefore to provide a design that does not need to estimate the critical group delay, thereby reducing the system complexity while maintaining performance. The predistorter proposed by the present invention is frequency-adaptive: it is calibrated according to frequency characteristics of an output signal of an amplifier that the predistorter is used to balance off, rather than the time-domain characteristics of the output signal as in the prior art.

According to one exemplary embodiment of the present invention, a communication system is disclosed. The communication system comprises a predistorter for distorting an input signal according to at least one parameter to generate a distorted signal, an amplifier for amplifying the distorted signal according to an input-output characteristics to generate an output signal, and a frequency-domain adaptive calibration module for adaptively adjusting the parameter of the predistorter according to frequency characteristics of the output signal.

According to another exemplary embodiment of the present invention, a signal processing method is disclosed. The signal processing method comprises distorting an input signal according to at least one parameter to generate a distorted signal, amplifying the distorted signal according to input-output characteristics to generate an output signal, and adaptively adjusting the parameter according to a frequency characteristic of the output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
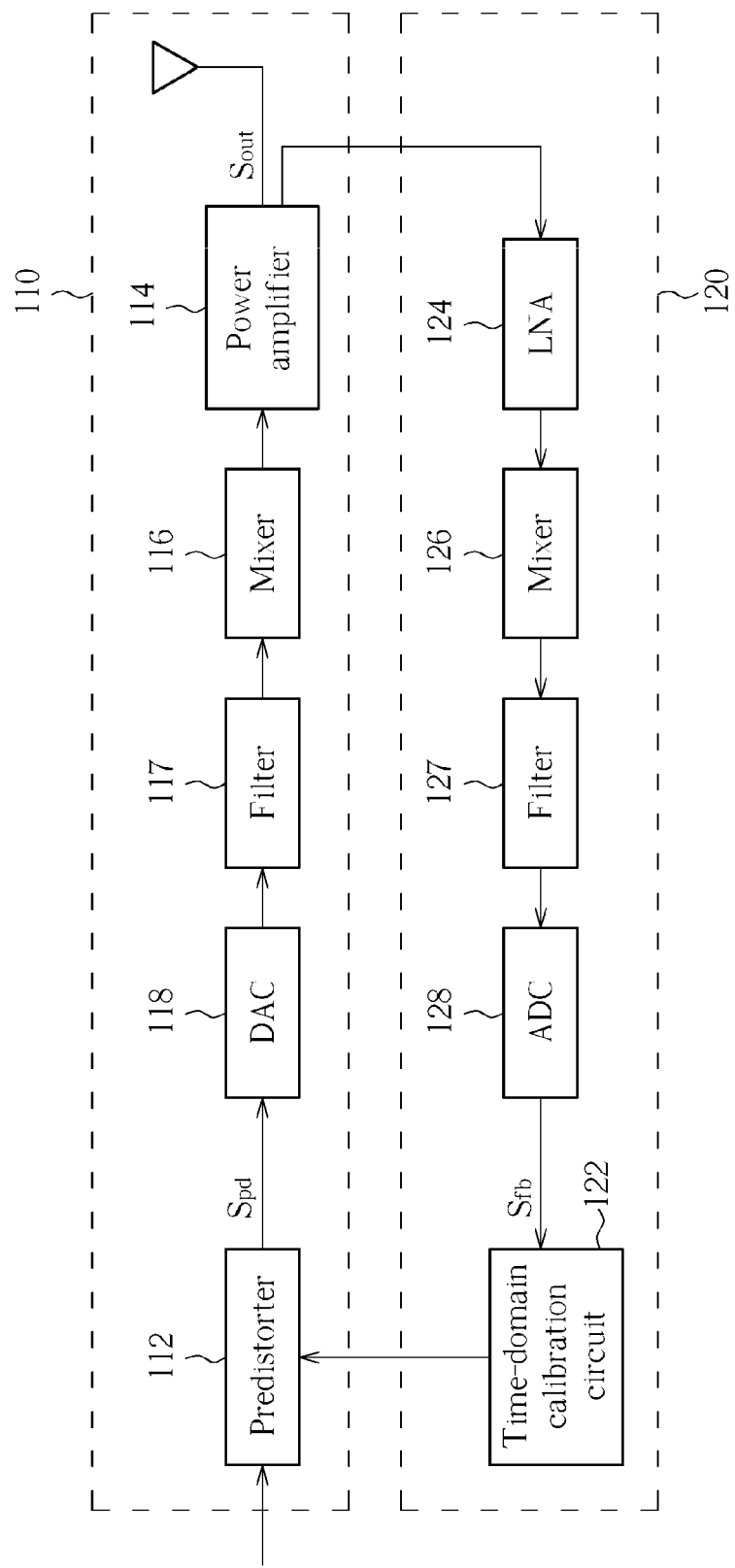
FIG. 1 is a block diagram showing a conventional structure of a predistorter and a power amplifier in a communication system.
Figure 2:
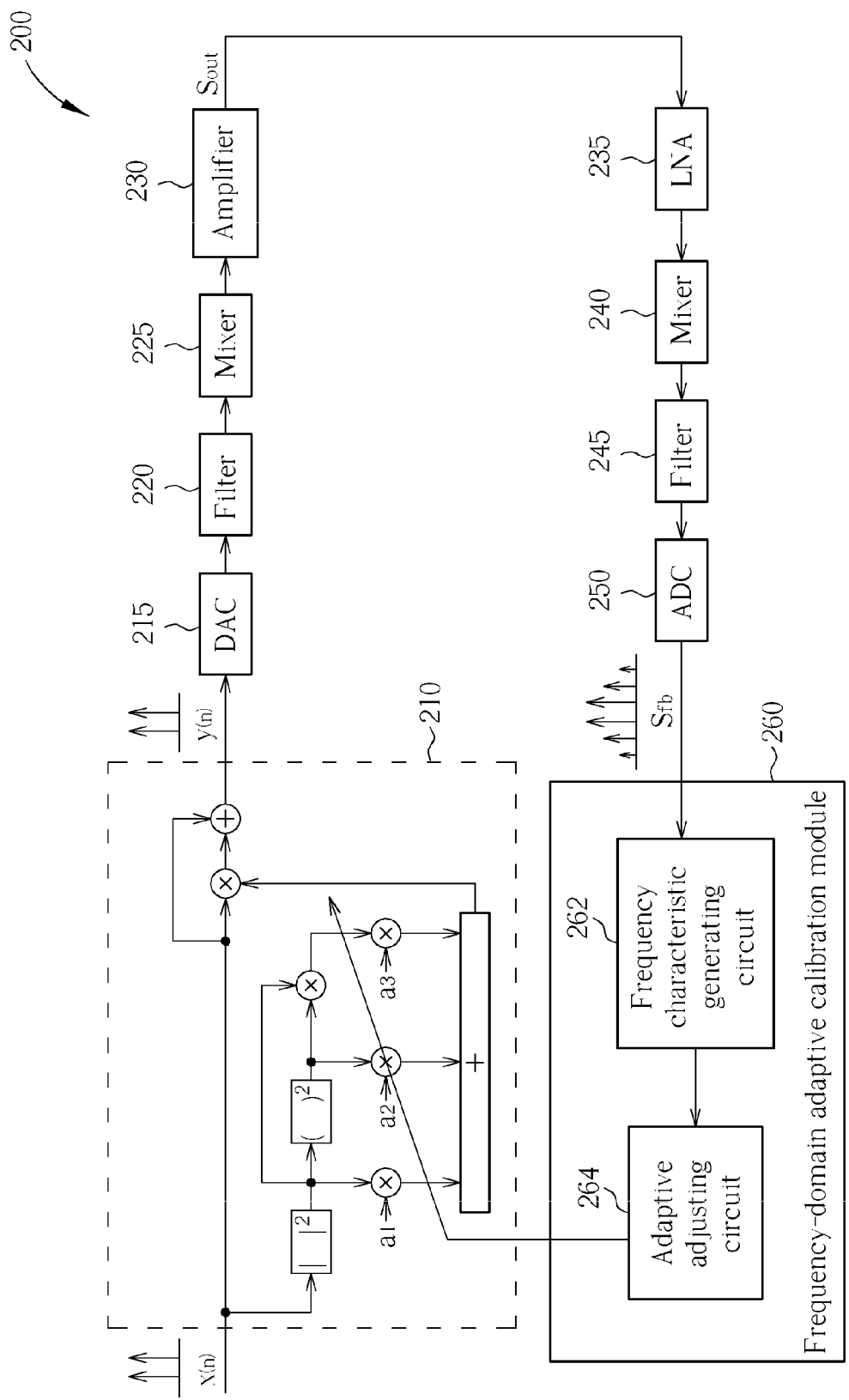
FIG. 2 shows a diagram of a communication system according to one exemplary embodiment of the present invention.

FIG. 2 shows a diagram of a communication system 200 having lower complexity as compared with the structure shown in FIG. 1 according to one exemplary embodiment of the present invention. The communication system 200 comprises a predistorter 210, a DAC 215, a filter 220, a mixer 225 and an amplifier 230 (note that the amplifier 230 can be, but is not limited to, a power amplifier that form part of a transmitter, and a LNA 235, a mixer 240, a filter 245, an ADC 250 and a frequency-domain adaptive calibration module 260 that form a feedback path. The predistorter 210 is modeled by a memoryless polynomial, and for the convenience of illustration, the order of the polynomial is limited so that the input-output characteristic of the predistorter 210 is expressed as the following equation (1) in this embodiment:

$$y(n) = (1 + a_1 \cdot |x(n)|^2 + a_2 \cdot |x(n)|^4 + a_3 \cdot |x(n)|^6) \cdot x(n) \quad (1),$$

where $a_1$-$a_3$ represent parameters of the predistorter 210, and are given with initial values; x(n) represents the input signal of the predistorter 210, and is chosen to be a predefined multi-tone training signal for predistorter calibration purpose; y(n) represents the output signal of the predistorter 210.

The predistorted signal y(n) output by the predistorter 210 is processed sequentially by the DAC 215, the filter 220, the mixer 225, and the amplifier 230, generating an output signal $S_{out}$ at the output end of the amplifier 230. As mentioned above, the input-output characteristic of the amplifier 230 is not linear, and the feedback path tries to let the overall characteristic of the predistorter 210 together with the amplifier 230 become more linear by adjusting the parameters $a_1$-$a_3$ of the predistorter 210.

Through the feedback path, the output signal $S_{out}$ is processed by the LNA 235, the mixer 240, the filter 245 and the ADC 250 to reverse the functions of the mixer 225, the filter 220 and the DAC 215. The processed result (i.e., the feedback signal $S_{fb}$) therefore only retains the effect of the amplifier 230: since the amplifier 230 is not linear, the feedback signal $S_{fb}$ is a multi-tone signal having a plurality of harmonic tones that cause in-band and out-of-band distortions. The frequency-domain adaptive calibration module 260 then adaptively adjusts the parameters $a_1$-$a_3$ of the predistorter 210 according to the feedback signal $S_{fb}$. Different from the prior art, the frequency-domain adaptive calibration module 260 detects and utilizes the frequency characteristic of the feedback signal $S_{fb}$, instead of the characteristic in the time-domain, to calibrate the predistorter 210. This enables the frequency-domain adaptive calibration module 260 not have to consider the group delay issue, thereby does not need complex and precise synchronization hardware.

Figure 3:
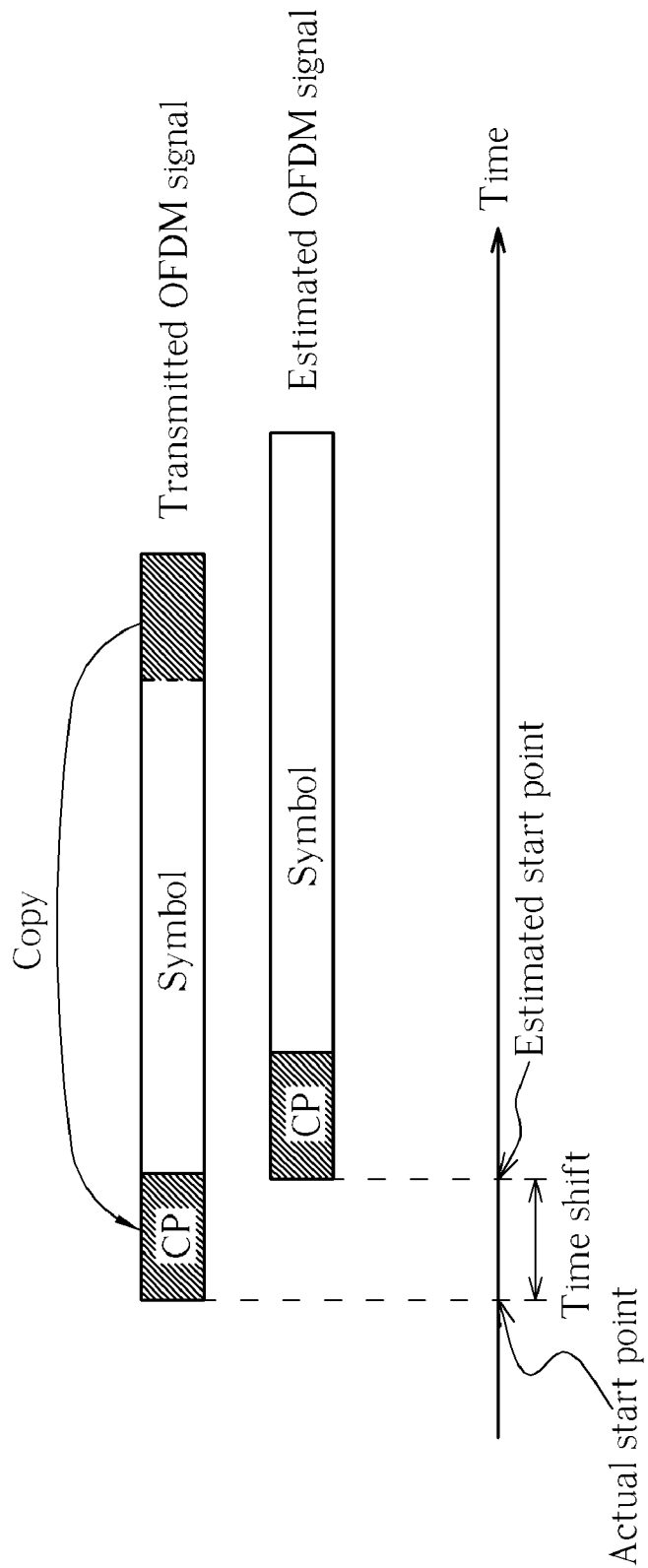
FIG. 3 shows a diagram of a transmitted OFDM signal and an estimated OFDM signal that has a time delay from the transmitted OFDM signal due to start-point detection error.

Take an OFDM signal as an example. As shown in FIG. 3, a cyclic prefix (CP), whose content is a copy of the end of an OFDM symbol, is preceding to the OFDM symbol. The purpose of the cyclic prefix is to overcome the multipath effect and remove inter-symbol-interference (ISI). By removing the cyclic prefix from the OFDM symbol after receiving the OFDM signal, the ISI can be removed. Because the time shift generated due to erroneously estimating the start point of the signal can be regarded as a kind of multipath effect, the cyclic prefix can also benefit the frequency-domain adaptive calibration module 260 to combat the group delay issue. Based on this property, as long as the difference between the actual start point and the start point identified by the frequency-domain adaptive calibration module 260 is within the range of cyclic prefix, the orthogonality is still held in the estimated OFDM symbol, and only a linear phase will be introduced. Since the linear phase will not affect the adjusted performance, the frequency-domain adaptive calibration module 260 has a wide error range maximized to 64 samples (the length of the cyclic prefix) for delay time estimation, which makes the estimation so much simpler than that in the time domain. The group delay issue therefore becomes non-critical in the frequency domain.

Please refer to FIG. 2 again. To depress the harmonic tones of the feedback signal $S_{fb}$, the frequency-domain adaptive calibration module 260 comprises a frequency-characteristic generating circuit 262 for processing the feedback signal $S_{fb}$ to obtain frequency characteristics (such as the amplitude or the power) of the harmonic tones, and an adaptive adjusting circuit 264 for adaptively adjusting the parameter $a_1$-$a_3$ according to the frequency characteristics of the harmonic tones.

In one embodiment, the frequency-characteristic generating circuit 262 comprises an FFT circuit. The FFT circuit transforms the feedback signal $S_{fb}$ from the time domain to the frequency domain to obtain the frequency distribution of the feedback signal $S_{fb}$. In another embodiment, the frequency-characteristic generating circuit 262 comprises a correlator, correlating the feedback signal $S_{fb}$ at each harmonic tone to obtain the frequency characteristic of each harmonic tone. Please note that the frequency-characteristic generating circuit 262 is not limited to the above embodiments; other circuits that can find the frequency characteristics of harmonic tones can also be implemented in the frequency-characteristic generating circuit 262.

Then, the detected frequency characteristic is delivered to the adaptive adjusting circuit 264 for predistorter calibration. The adaptive adjusting circuit 264 adaptively adjusts the parameter $a_1$-$a_3$ in a way that the amplitude or the power of the harmonic tones can be decreased within a predetermined range (for example, as close to zero as possible). The adaptive adjusting circuit 264 defines a cost function corresponding to the amplitude or the power of the harmonic tones, and finds a parameter adjustment that reduces the cost value of the cost function by using an adaptive algorithm (e.g., a finite difference algorithm or a secant algorithm). The cost function may be a summation of the power of the harmonic tones, the summation of the weighted power of the harmonic tones, or the maximum power of the harmonic tones, etc. The following shows an example of the actions of the adaptive adjusting circuit 264.

The adaptive adjusting circuit 264 first defines a performance metric according to the selected optimization criterion, for example, $$J_c(\overline{P}) = \max_{k \in 2 \ldots M} |c(k)|^2, \quad (2)$$

where $\overline{P}$ represents the coefficients of the predistorter 210 ($\overline{P} = [a_{1,r}, a_{1,i}, a_{2,r}, a_{2,i}, a_{3,r}, a_{3,i}]$), and c(2), c(3), . . . , c(M) represent the power of the harmonic tones at $f = 2 \cdot f_x$, $3 \cdot f_x$, . . . , $M \cdot f_x$, wherein $f_x$ is the transmitted tone. The optimal solution of the coefficients can be found by solving the equation:

$$\overline{P}_{opt} = \arg\min_{\overline{P}} J_o(\overline{P}).$$

However, it is hard to analyze the optimal solution, so a finite difference method is adopted to obtain an approximate optimal solution. In brief, the finite difference method substitutes a first set of $\overline{P}$ into equation (2) to obtain a first cost value, and substitutes a second set of $\overline{P}$, which is the first set of $\overline{P}$ added by a slight difference, into equation (2) to obtain a second cost value. By comparing the first and the second cost values, a slope is determined. The adaptive adjusting circuit 264 then determines a convergence direction of $\overline{P}$ according to the slope. After certain iterations, a convergence of $\overline{P}$ can be found. Since a person having ordinary skill in the art can readily appreciate how to utilize the finite difference method or other methods to find the optimal solution (or solution that is approximate to optimum), the detailed description is omitted here for brevity. The selection of the cost function and the adaptive algorithm is not limiting: other cost function/adaptive algorithms that are different from the above embodiments shall also fall within the scope of the present invention.

Figure 4:
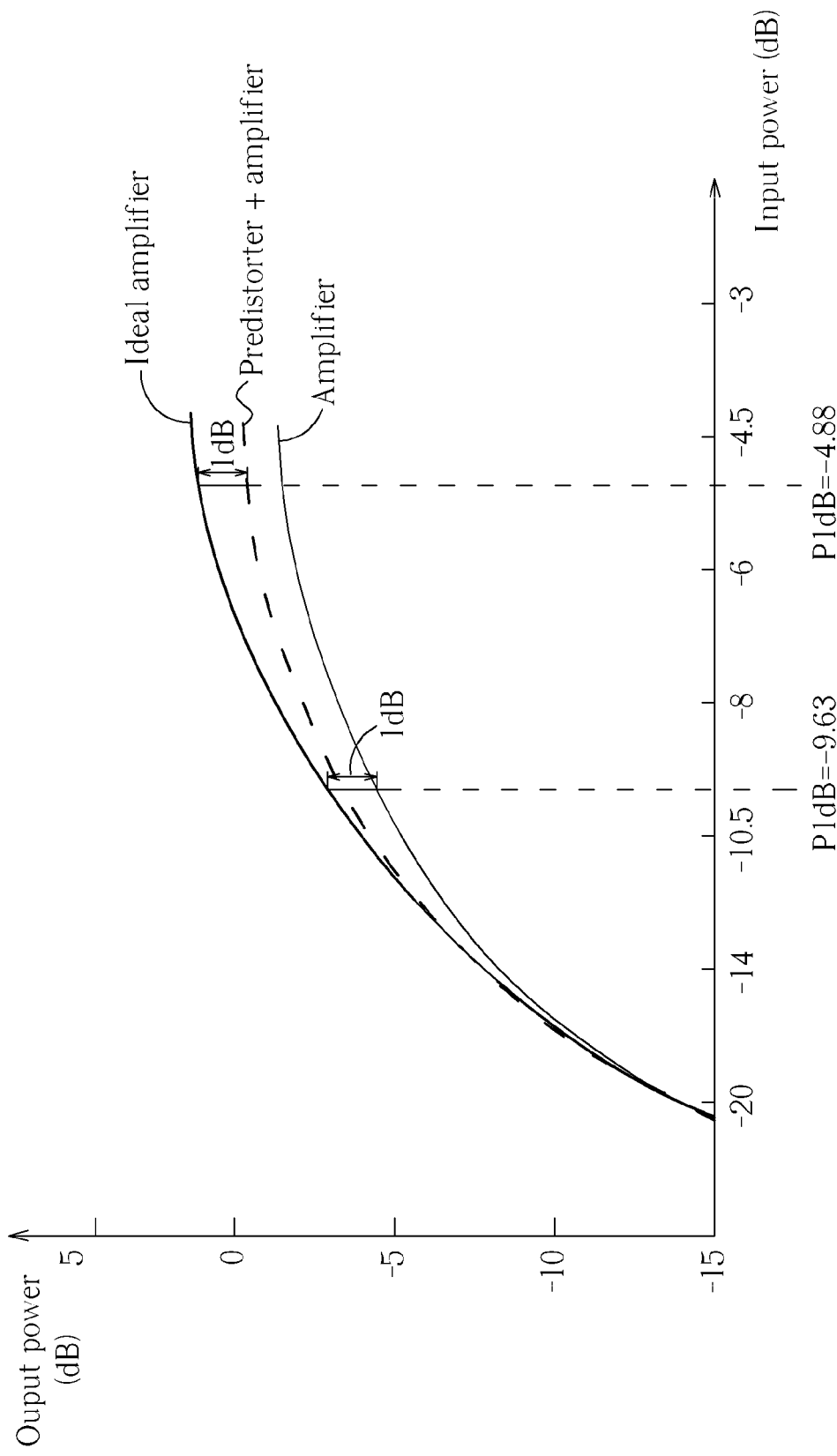
FIG. 4 shows a performance evaluation of input-output characteristics of the amplifier in a log domain.
Figure 5:
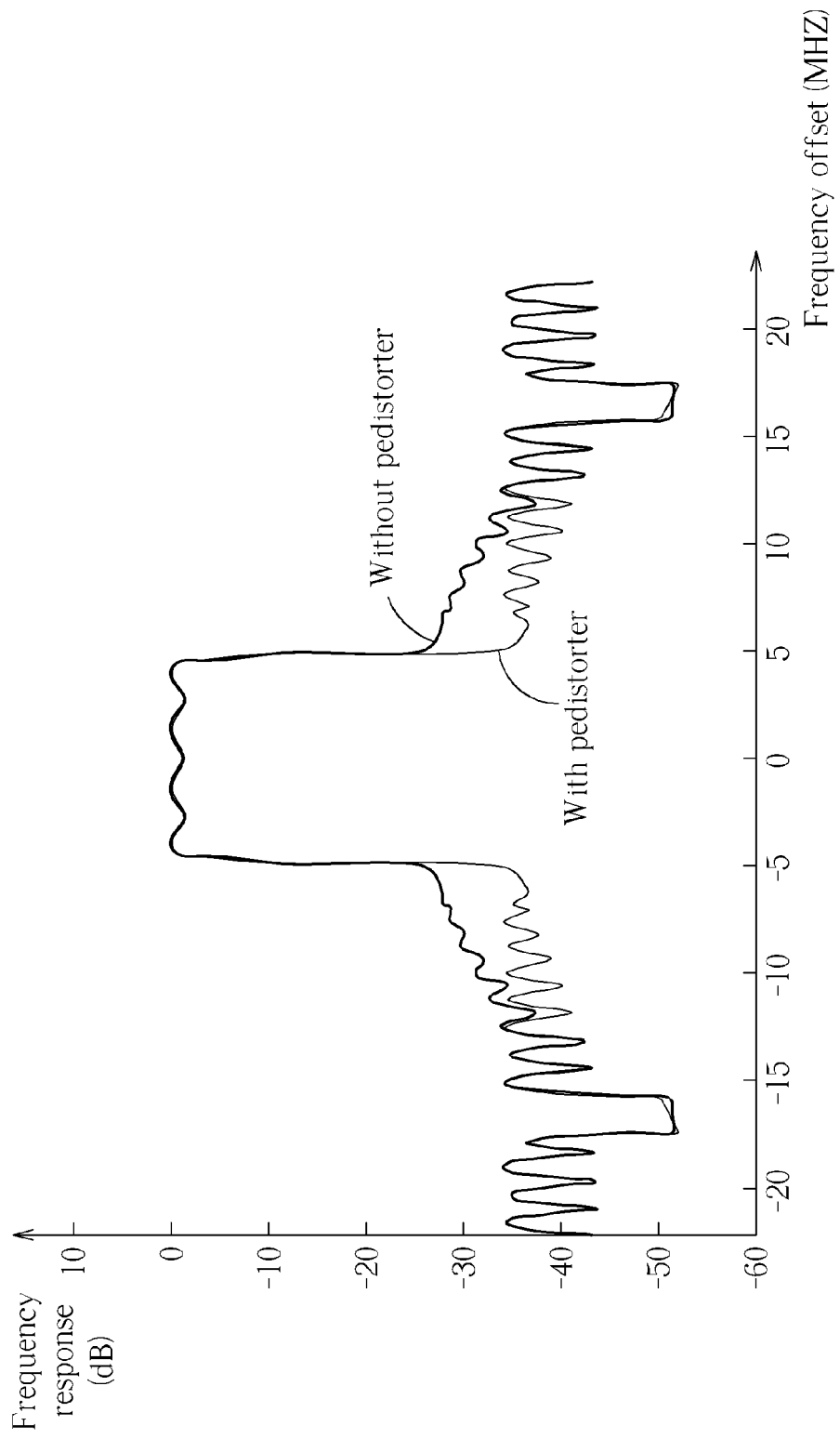
FIG. 5 shows another performance evaluation from the aspect of power spectral density (PSD) of the output signal $S_{out}$.

After the adaptive adjusting circuit 264 has adjusted the coefficients $a_1$-$a_3$ of the predistorter 210 according to the convergence of $\overline{P}$, the nonlinearity of the amplifier 230 is balanced. In the simulation, the existence of the predistorter 210 improves the usable maximum power of the amplifier 210 from 22.5 dBm to 27.5 dBm under the condition of 64 QAM ¾ and EVM less than −30 dB. FIG. 4 shows a performance evaluation of input-output characteristics of the amplifier 230 in the log domain. As can be seen, the characteristics of the amplifier 230 with the predistorter 210 closely approach the ideal curve, the P1 dB point where the output power differs from the ideal value by 1 dB is also improved by 4.75 dB (20·log(0.57/0.33)=4.75 dB) due to the predistorter 210. FIG. 5 shows another performance evaluation from the aspect of power spectral density (PSD) of the output signal $S_{out}$. With the existence of the predistorter 210, the spectral regrowth resulting from the nonlinear amplifier 230 is depressed, therefore the in-band and out-of-band interference are decreased.

Except for the polynomial-based predistorter 210 shown in FIG. 2, a predistorter can be modeled by a look-up table (LUT). Please refer to FIG. 6, which shows a diagram of a communication system 600 comprising a LUT-based predistorter 610 according to one exemplary embodiment of the present invention. The predistorter 610 has established an amplitude mapping table 612 and a phase mapping table 614, each comprising a plurality of entries. The predistorter 610 detects the amplitude of the input signal x(n), looks it up in the amplitude mapping table 612 and the phase mapping table 614, and finds the mapping values for amplitude and phase. The predistorted signal y(n) is expressed by $|A(|x_n|)|e^{\angle A(|xn|)}$.

Similar to the structure of FIG. 2, the entries of the amplitude mapping table 612 and the phase mapping table 614 are calibrated by a frequency-domain adaptive calibration module 660 according to the frequency characteristics of the feedback signal $S_{fb}$. The functions of the frequency-characteristic generating circuit 662 and the adaptive adjusting circuit 664 are substantially the same as that of frequency-characteristic generating circuit 262 and adaptive adjusting circuit 264: the frequency-characteristic generating circuit 662, such as an FFT circuit or a correlator, processes the feedback signal $S_{fb}$ to obtain the frequency characteristic of harmonic tones, and the adaptive adjusting circuit 664 adaptively adjusts the parameters of the predistorter 610 (the mapping entries in this embodiment) in order to reduce the harmonic tones of the feedback signal $S_{fb}$. Because the predistorter calibration is performed in the frequency domain, the frequency-domain adaptive calibration module 660 does not need to worry about the group delay issue, and the circuit complexity and the computation complexity can both be decreased as compared with the prior art.

Figure 6:
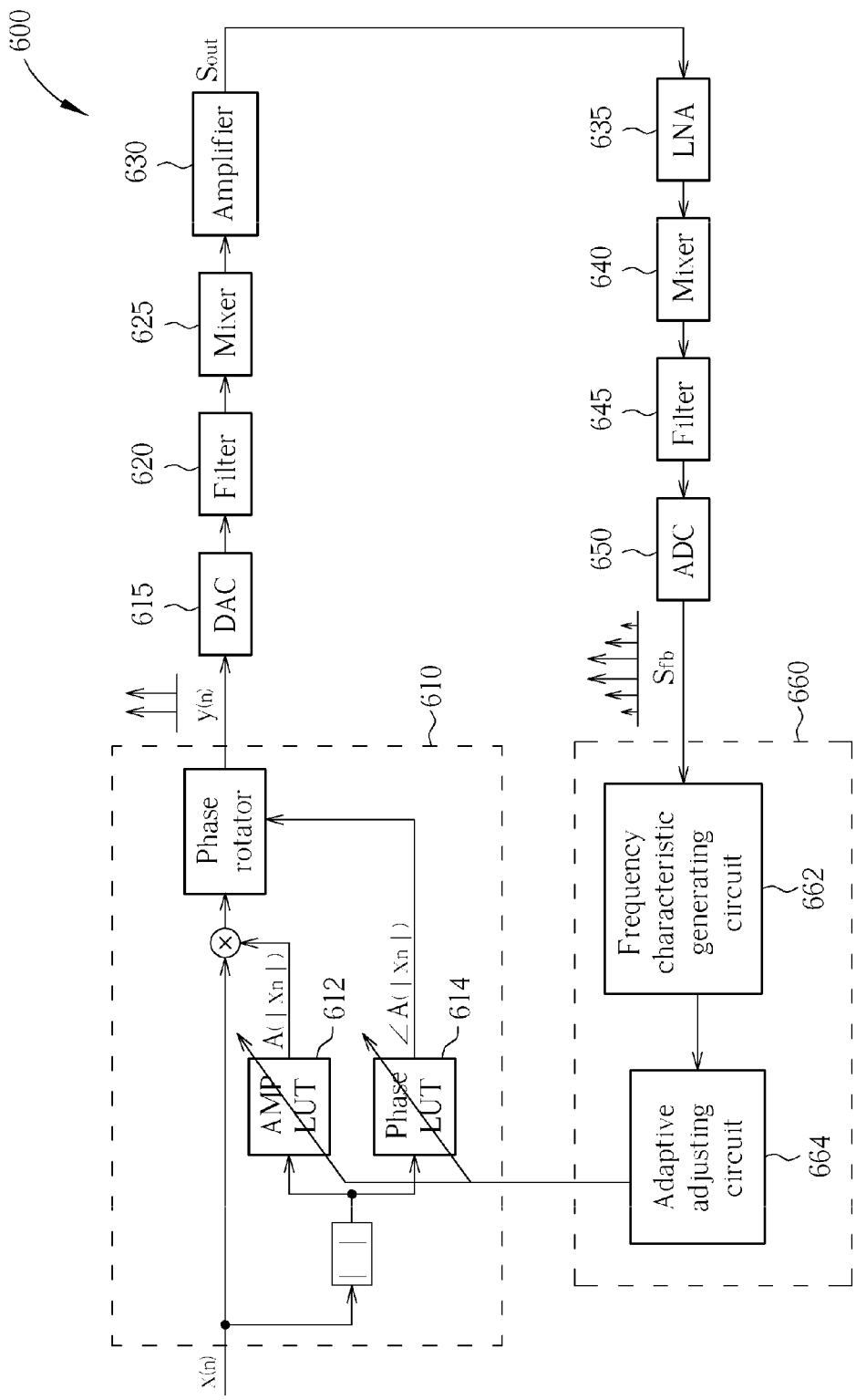
FIG. 6 shows a diagram of a communication system according to another exemplary embodiment of the present invention.
Figure 7:
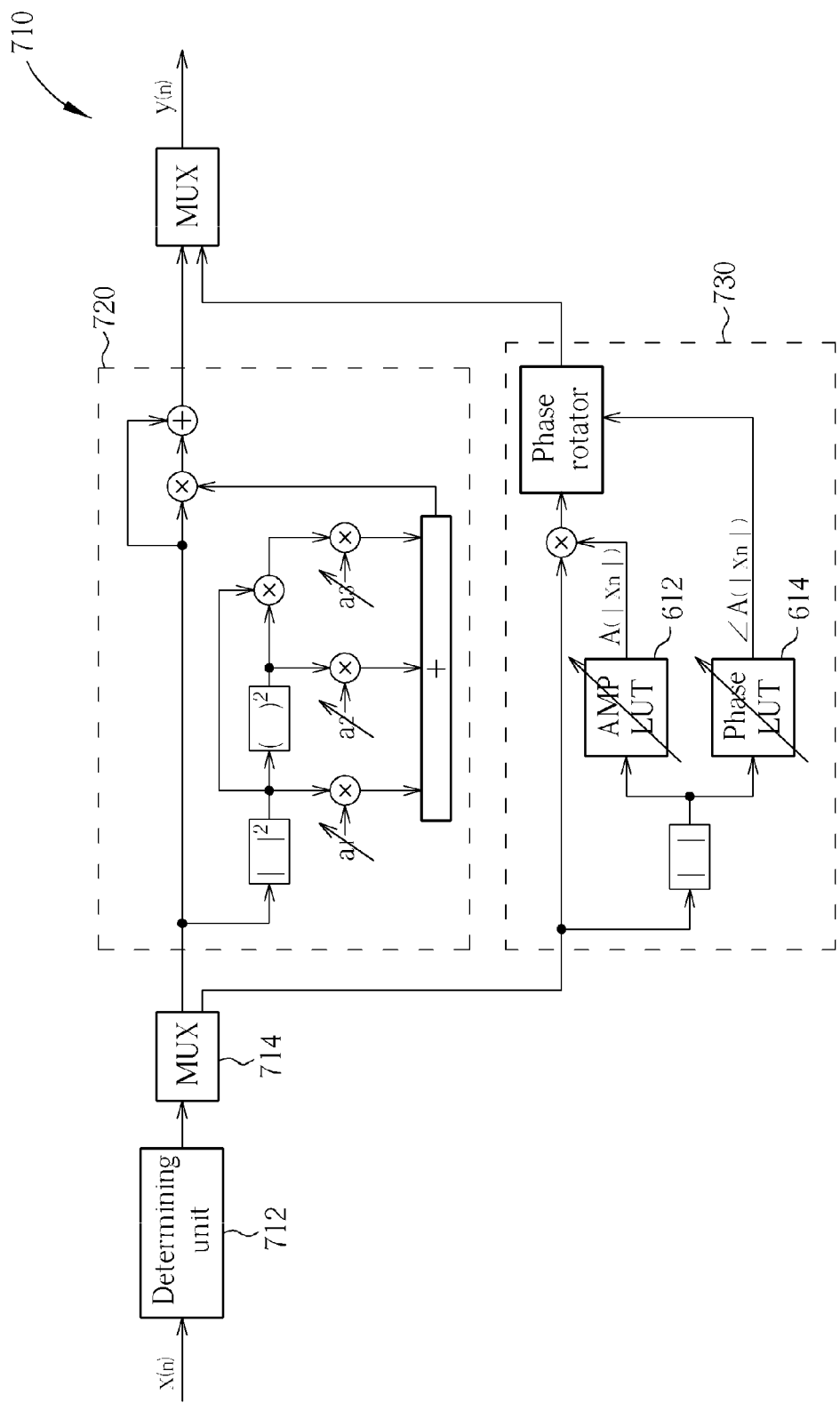
FIG. 7 shows a diagram of a communication system according to another exemplary embodiment of the present invention.

Based on the structures shown in FIG. 2 and FIG. 6, a polynomial-LUT-mixed predistorter is proposed in FIG. 7. The polynomial-LUT-mixed predistorter 710 comprises a determining unit 712 for detecting the amplitude (or power) of the input signal x(n). In this embodiment, when the amplitude (or power) of the input signal x(n) is in a first range, a multiplexer 714 coupled to the determining unit 712 inputs the signal x(n) to a polynomial-based predistortion module 720 in order to distort the input signal x(n) according to a polynomial $y(n)=(1+a_1 \cdot |x(n)|^2+a_2 \cdot |x(n)|^4+a_3 \cdot |x(n)|^6) \cdot x(n)$. Otherwise, the multiplexer 714 inputs the signal x(n) to a LUT-based predistortion module 730 to distort the input signal x(n) according to look-up tables. The coefficients $a_1$-$a_3$ and the tables are adjustable: an adaptive adjusting circuit (not shown) adjusts at least one coefficient of the polynomial when the input signal x(n) is in the first range, and adjusts at least one entry of the tables when the input signal x(n) is in the second range. Since a person with ordinary skill in the art can appreciate how to implement the structure and the predistorter calibration after reading above descriptions, further disclosure is omitted here for brevity.

In conclusion, above embodiments utilize the frequency-characteristic generating circuit 262(662) to obtain the frequency characteristic of the harmonic tones of the feedback signal $S_{fb}$, and utilizes the adaptive adjusting circuit 264(664) to analyze the defined cost function corresponding to the frequency characteristic of the harmonic tones and adjusts the parameters (e.g., the coefficients in the polynomial or the entries in the look-up tables) so as to depress the component of the harmonic tones. In this way, the overall input-output characteristic of the amplifier 230(630) together with the predistorter 210(610) becomes linear without having to estimate and compensate the group delay generating by the feedback path over time domain.

Moreover, note that the FFT circuit and the correlator are commonly used existing circuits in a wireless communication system, such as a WiMAX system, and the adaptive adjusting circuit can be realized by digital signal processing (DSP), the frequency-domain adaptive calibration module is easy for implementation. The system complexity and production cost is therefore reduced without loss of performance.

Those skilled in the art will readily observe that numerous modifications and alterations of the device and method may be made while retaining the teachings of the invention.

What is claimed is:

1. A communication system, comprising:
   a predistorter, for distorting an input signal according to at least one parameter to generate a distorted signal;
   an amplifier, coupled to the predistorter, for amplifying the distorted signal according to an input-output characteristic to generate an output signal; and
   a frequency-domain adaptive calibration module, coupled to the predistorter and the amplifier, for adaptively adjusting the parameter according to a frequency characteristic of the output signal, wherein the frequency-domain adaptive calibration module comprises:
      a frequency-characteristic generating circuit, coupled to the amplifier, for processing the output signal to obtain a frequency characteristic of at least one specific tone of the output signal; and
      an adaptive adjusting circuit coupled to the frequency-characteristic generating circuit and the predistorter, for adaptively adjusting the parameter according to the frequency characteristic of the specific tone.

2. The communication system of claim 1, wherein the frequency-characteristic generating circuit comprises an FFT circuit, coupled to the amplifier, for transforming the output signal to obtain the frequency characteristic of the specific tone.

3. The communication system of claim 1, wherein the frequency-characteristic generating circuit comprises a correlator, coupled to the amplifier, for correlating the output signal at the specific tone to obtain the frequency characteristic of the specific tone.

4. The communication system of claim 1, wherein the adaptive adjusting circuit adaptively adjusts the parameter to make the frequency characteristic of the specific tone within a predetermined range.

5. The communication system of claim 4, wherein the adaptive adjusting circuit adaptively adjusts the parameter to decrease an amplitude or a power of the specific tone.

6. The communication system of claim 5, wherein the adaptive adjusting circuit defines a cost function corresponding to the amplitude or the power of the specific tone, and finds a parameter adjustment that reduces a cost value of the cost function by using an adaptive algorithm.

7. The communication system of claim 1, wherein the input signal is a multi-tone signal, and the specific tone is a harmonic tone of the multi-tone signal.

8. A communication system, comprising:
   a predistorter, for distorting an input signal according to at least one parameter to generate a distorted signal;
   an amplifier, coupled to the predistorter, for amplifying the distorted signal according to an input-output characteristic to generate an output signal; and
   a frequency-domain adaptive calibration module, coupled to the predistorter and the amplifier, for adaptively adjusting the parameter according to a frequency characteristic of the output signal;
   wherein the predistorter is a polynomial-LUT-mixed predistorter that distorts the input signal according to a polynomial when the input signal is in a first range and distorts the input signal according to a look-up table (LUT) when the input signal is in a second range, and the adaptive adjusting circuit adjusts at least one coefficient of the polynomial when the input signal is in the first range and adjusts at least one entry of the LUT when the input signal is in the second range.

9. A signal processing method, comprising:
   distorting an input signal according to at least one parameter to generate a distorted signal;
   amplifying the distorted signal according to an input-output characteristic to generate an output signal; and
   adaptively adjusting the parameter according to a frequency characteristic of the output signal, wherein the step of adaptively adjusting the parameter comprises:
   processing the output signal to obtain a frequency characteristic of at least one specific tone of the output signal; and
   adaptively adjusting the parameter according to the frequency characteristic of the specific tone.

10. The signal processing method of claim 9, wherein the step of processing the output signal comprises using a FFT circuit to transform the output signal to obtain the frequency characteristic of the specific tone.

11. The signal processing method of claim 9, wherein the step of processing the output signal comprises correlating the output signal at the specific tone to obtain the frequency characteristic of the specific tone.

12. The signal processing method of claim 9, wherein the step of adaptively adjusting the parameter comprises adaptively adjusting the parameter to make the frequency characteristic of the specific tone within a predetermined range.

13. The signal processing method of claim 12, wherein the step of adaptively adjusting the parameter to make the frequency characteristic of the specific tone within the predetermined range comprises adaptively adjusting the parameter to decrease an amplitude or a power of the specific tone.

14. The signal processing method of claim 13, wherein the step of adaptively adjusting the parameter to decrease the amplitude or the power of the specific tone comprises:
   defining a cost function corresponding to the amplitude or the power of the specific tone; and
   finding a parameter adjustment that reduces a cost value of the cost function by using an adaptive algorithm.

15. The signal processing method of claim 9, wherein the input signal is a multi-tone signal, and the specific tone is a harmonic tone of the multi-tone signal.

16. A signal processing method, comprising:
   distorting an input signal according to at least one parameter to generate a distorted signal;
   amplifying the distorted signal according to an input-output characteristic to generate an output signal; and
   adaptively adjusting the parameter according to a frequency characteristic of the output signal;
   wherein the step of distorting the input signal according to the parameter comprises distorting the input signal according to a polynomial when the input signal is in a first range, and distorting the input signal according to a look-up table when the input signal is in a second range; and the step of adaptively adjusting the parameter comprises adjusting at least one coefficient of the polynomial when the input signal is in the first range, and adjusting at least one entry of the look-up table when the input signal is in the second range.

* * * * *